US009680087B2

(12) United States Patent
Mani

(10) Patent No.: US 9,680,087 B2
(45) Date of Patent: Jun. 13, 2017

(54) METHODS FOR MANUFACTURING CARBON RIBBONS FOR MAGNETIC DEVICES

(71) Applicant: III Holdings 1, LLC, Wilmington, DE (US)

(72) Inventor: Krishnakumar Mani, San Jose, CA (US)

(73) Assignee: III HOLDINGS 1, LLC, Wilmington, DE (US)

( * ) Notice: Subject to any disclaimer, the term of this patent is extended or adjusted under 35 U.S.C. 154(b) by 0 days.

(21) Appl. No.: 15/234,549

(22) Filed: Aug. 11, 2016

(65) Prior Publication Data

US 2016/0351796 A1    Dec. 1, 2016

Related U.S. Application Data

(63) Continuation of application No. 14/538,423, filed on Nov. 11, 2014, now Pat. No. 9,419,205, which is a continuation of application No. 13/427,373, filed on Mar. 22, 2012, now Pat. No. 8,900,883.

(51) Int. Cl.

| H01L 21/00 | (2006.01) |
| H01L 43/02 | (2006.01) |
| H01L 27/22 | (2006.01) |
| H01L 43/08 | (2006.01) |
| H01L 43/12 | (2006.01) |
| H01L 23/532 | (2006.01) |
| G11C 11/15 | (2006.01) |
| G11C 11/16 | (2006.01) |
| H01L 21/02 | (2006.01) |

(52) U.S. Cl.
CPC .......... *H01L 43/02* (2013.01); *G11C 11/1673* (2013.01); *G11C 11/1675* (2013.01); *H01L 23/53276* (2013.01); *H01L 27/228* (2013.01); *H01L 43/08* (2013.01); *H01L 43/12* (2013.01); *G11C 11/15* (2013.01); *G11C 11/16* (2013.01); *G11C 2213/35* (2013.01); *H01L 21/0262* (2013.01); *H01L 21/02527* (2013.01)

(58) Field of Classification Search
CPC ............. G11C 11/1673; G11C 11/1675; H01L 23/532376; H01L 27/228; H01L 43/12
USPC ........................................................ 438/3
See application file for complete search history.

(56) References Cited

U.S. PATENT DOCUMENTS

| 6,845,038 B1 | 1/2005 | Shukh |
| 6,900,002 B1 | 5/2005 | Plat et al. |
| 8,093,576 B1 | 1/2012 | Lee |
| 2005/0233257 A1 | 10/2005 | Latchford et al. |
| 2006/0292808 A1 | 12/2006 | Autryve et al. |
| 2007/0018218 A1 | 1/2007 | Kretz |
| 2007/0141256 A1 | 6/2007 | Liebau et al. |
| 2009/0201715 A1 | 8/2009 | Kreupl |
| 2011/0204474 A1 | 8/2011 | Kreupl et al. |
| 2012/0132822 A1 | 5/2012 | Okada |

*Primary Examiner* — Long K Tran
(74) *Attorney, Agent, or Firm* — McAndrews, Held & Malloy, Ltd.

(57) ABSTRACT

In one embodiment of the invention, there is provided a method for manufacturing a magnetic memory device, comprising: depositing a carbon layer comprising amorphous carbon on a substrate; annealing the carbon layer to activate dopants contained therein; and selectively etching portions of the carbon layer to forms lines of spaced apart carbon conductors.

20 Claims, 16 Drawing Sheets

METHODS FOR MANUFACTURING CARBON RIBBONS FOR MAGNETIC DEVICES

BACKGROUND

Magnetic memory device may include magnetic memory circuits that are based on magneto-resistive behavior of magnetic storage elements that are integrated typically with a complementary metal-oxide-semiconductor (CMOS) technology. Such memory circuits generally provide non-volatility and an unlimited read and write capability. An example is the magnetic random access memory (MRAM) circuit that includes a plurality of memory cells, each defining an addressable magnetic storage element that may include a magnetic tunnel junction (MTJ) stack.

Each addressable MTJ stack can have a magnetic spin orientation and can be flipped between two states by the application of a magnetic field that is induced by energizing corresponding bit and word lines. Conductive wires comprising the word and bit lines are required to carry a high current density in order to generate the switching fields necessary to operate the magnetic memory circuits.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, embodiments of the present invention disclose techniques to manufacture conductive carbon wires and ribbons for magnetic memory devices. A magnetic memory device with conductive carbon wire is also disclosed.

Figure 1A:
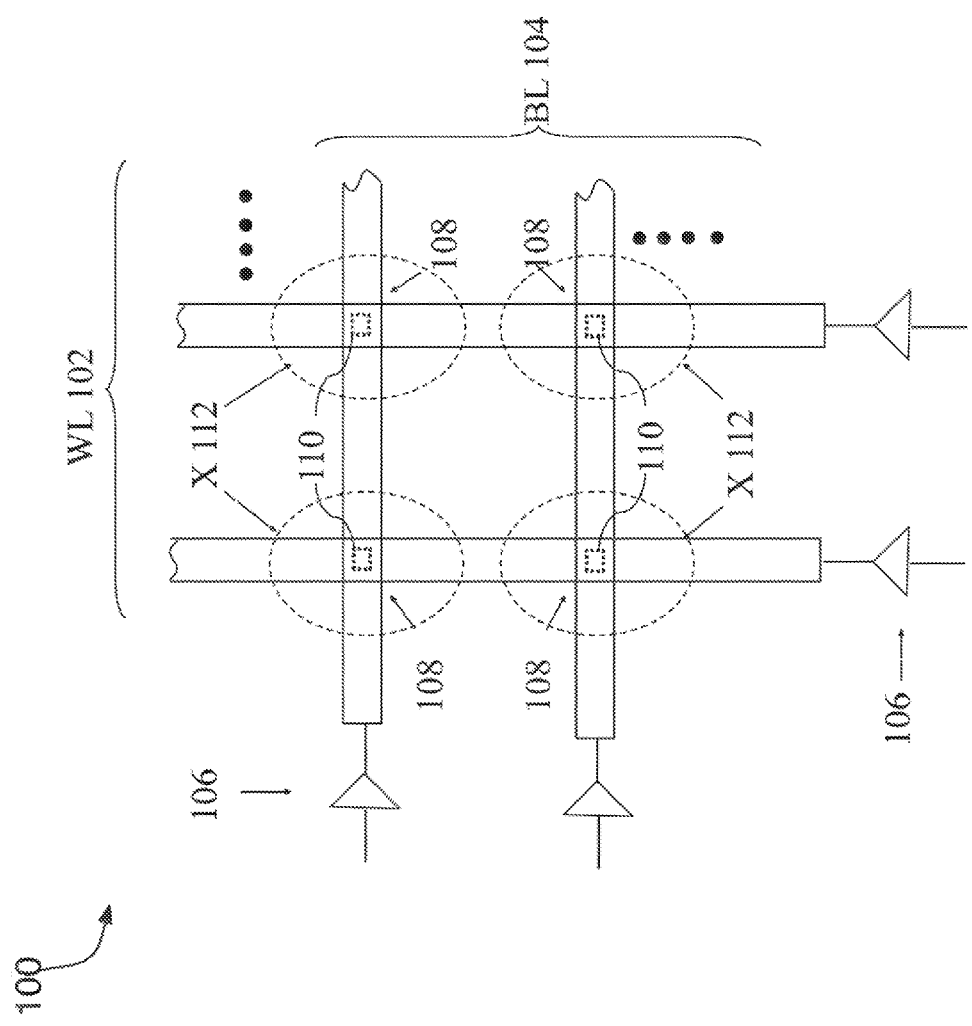
FIG. 1A shows a plan view of an exemplary array of memory cells.

FIG. 1A illustrates a plan view of a section of an exemplary array 100 of memory cells X 112 in an MRAM circuit, that includes a set of longitudinal word lines (WL) 102 and a set of transverse bit lines (BL) 104. The set of bit lines 104 overlies the set of word lines 102 to define crossover zones 108. An addressable MTJ stack 110 is disposed within each crossover zone 108. Current drivers 106 are provided for energizing the bit lines 104 and the word lines 102. An address transistor (not shown) is provided under each MTJ stack 110 and in the memory cell X 112, for reading the state of the MTJ stack 110.

Figure 1B:
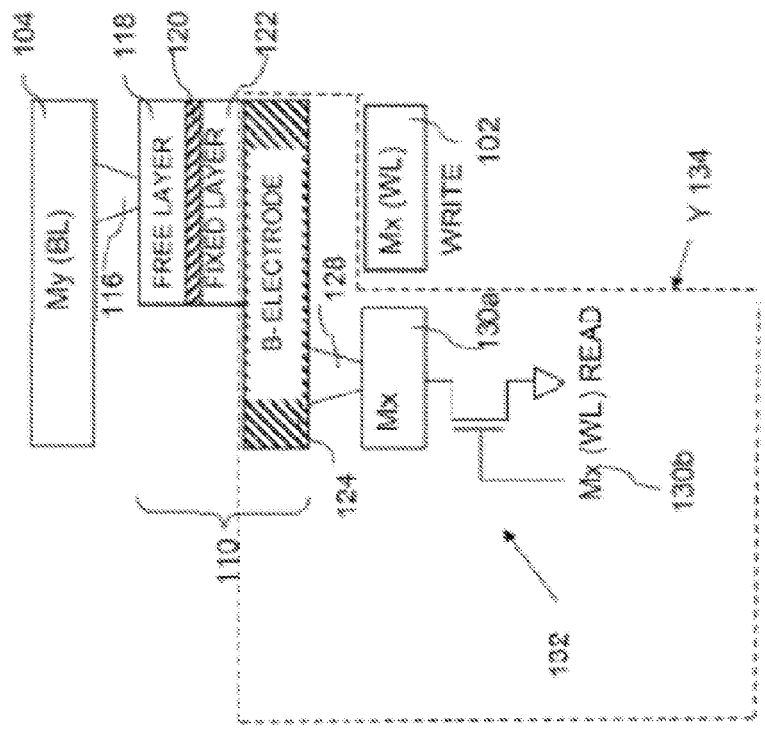
FIG. 1B shows a partly schematic and partly cross-sectional view of the memory cell of FIG. 1A

FIG. 1B illustrates a partly schematic and partly cross-sectional view of the memory cell X 112 in FIG. 1A. As shown in the cross-sectional view, the MTJ stack 110 is disposed within the crossover zone 108. The address transistor 132 is shown schematically.

Generally, the MTJ stack 110 is designed to be integrated into a back-end metallization structure following a front-end CMOS processing. The MTJ stack 110 is shown to be provided between a first metallization layer Mx and a second metallization layer My, wherein the MTJ stack 110 is connected to the first layer Mx through a via hole 128 and to the second layer My through a via hole 116. The second layer My is patterned to include the BL 104. The MTJ stack 110 includes a free layer 118, a tunnel oxide layer 120, a fixed layer 122 and an extended bottom electrode 124. The first layer Mx is patterned to include the WL 102 for writing into the MTJ stack 110. The address transistor 132 is connected to the first layer Mx by a connection 130a. A read word line (WL) 130b in the first layer Mx is usable for selectively operating the address transistor 132. The WL 102 has no contact with the bottom electrode 124, and when energized, induces a magnetic field within the MTJ stack 110.

A write operation in a selected memory cell X 112 in the array 100 can be performed by energizing the corresponding BL 104 and the WL 102, to generate a magnetic field for changing the magnetic state of the corresponding MTJ stack 110. For a read operation, a voltage is applied to the BL 104 of the selected memory cell X 112, so that a current can flow through the corresponding MTJ stack 110 and the address transistor 132 that is selectively switched on by the WL 130b. The magnitude of the current sensed indicates the conductivity or the magnetic state of the MTJ stack 110.

The bit lines and the word lines of the MRAM device described above may be implemented as conductive carbon wires/ribbons fabricated in accordance with any one of the embodiments described below.

Various embodiments of the method for manufacturing conductive wires/ribbons will now be described with reference to FIGS. 2 to 5 of the drawings. In these drawings the same reference numerals have been used to indicate the same or similar features and steps.

First Embodiment

Figure 2A:
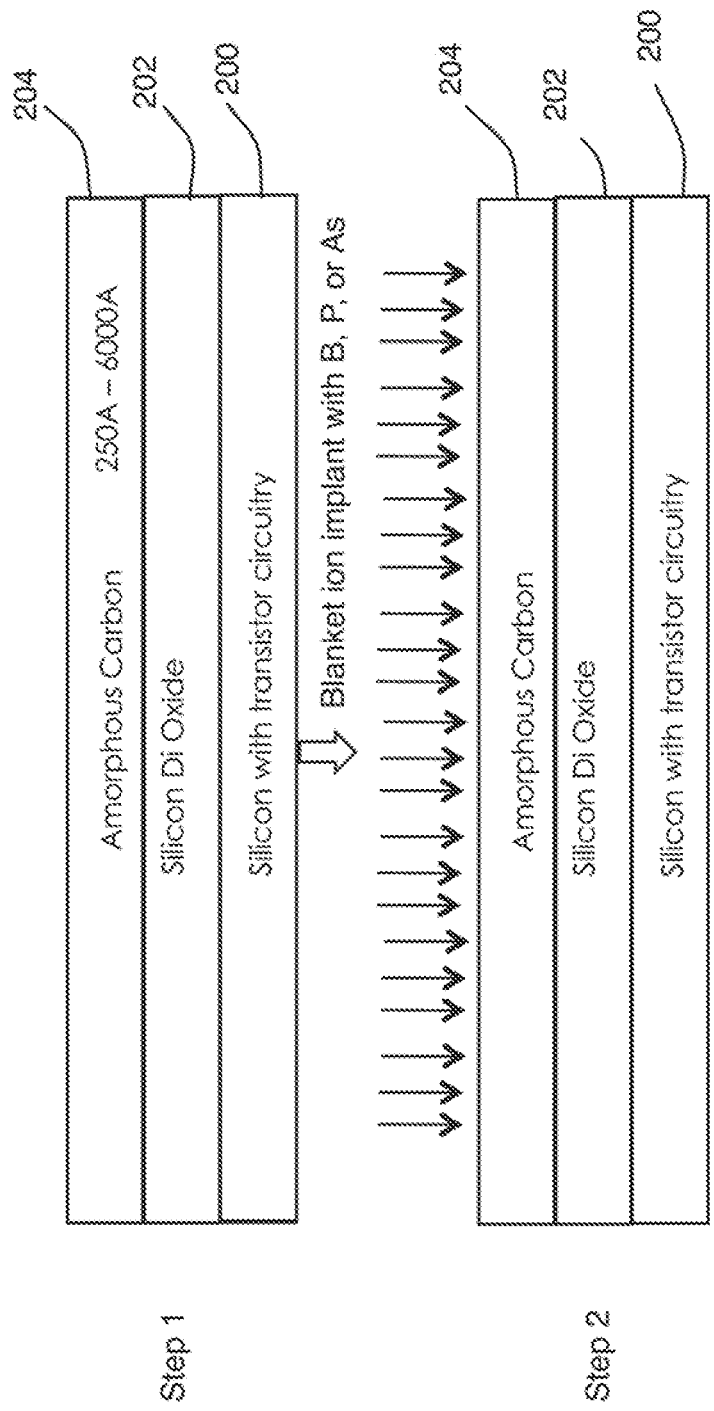
FIGS. 2A-B illustrates a process for forming conductive carbon ribbons for a magnetic memory, in accordance with a first embodiment of the invention.
Figure 2B:
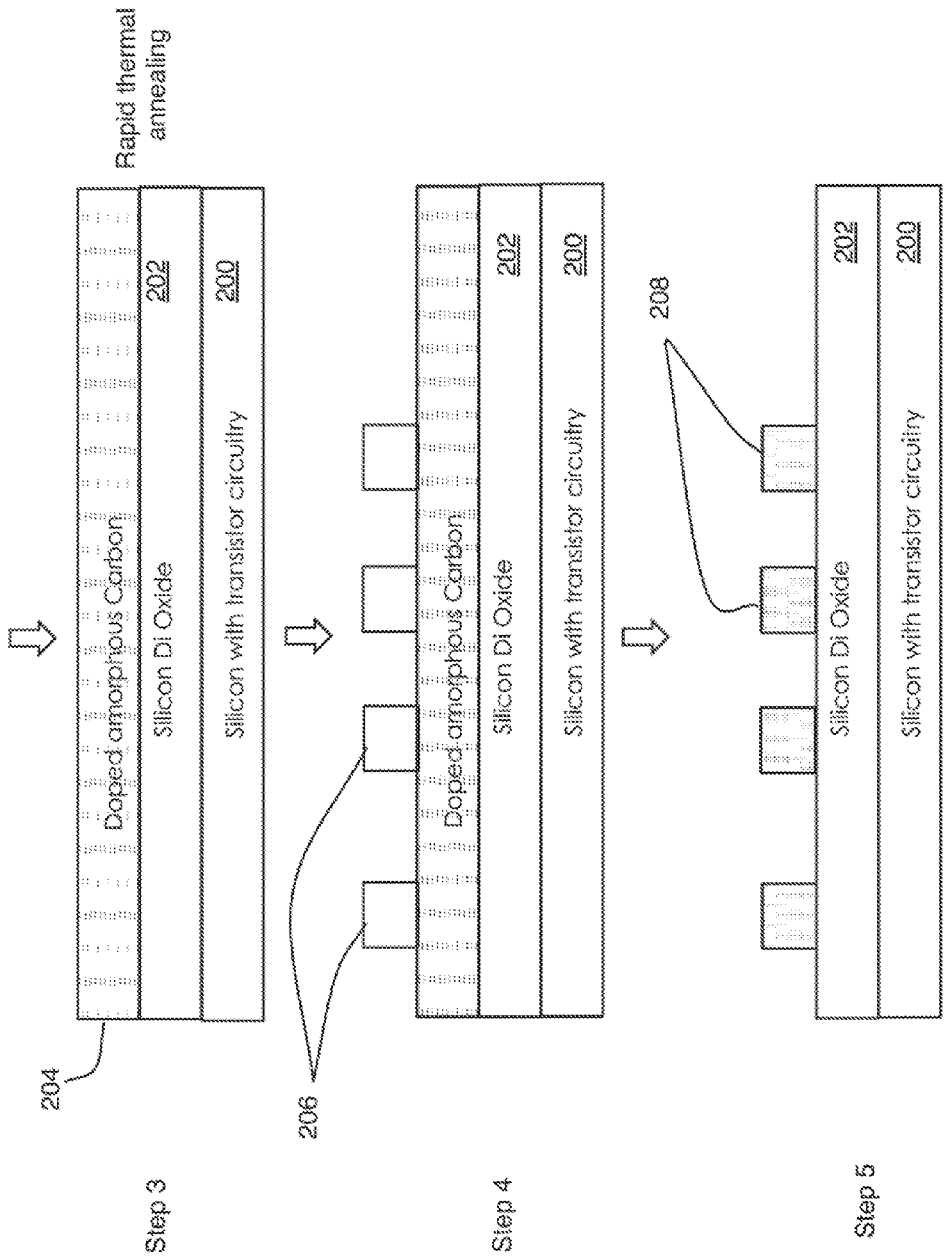

A first embodiment of a process for forming conductive carbon ribbons for a magnetic memory device is illustrated in FIGS. 2a-b. Referring to FIGS. 2a-b, reference numeral 200 indicates a silicon wafer with prefabricated circuitry, whereas reference numeral 202 indicates an oxide film layer or dielectric layer. At step 1, using PECVD (Plasma Enhanced Chemical Vapor Deposition) techniques with a suitable source such as C2H2 or C3H6, a film of amorphous carbon 204 is deposited on the layer 202. In one embodiment the layer 204 may be between 250 angstroms to 6000 angstroms. At step 2, the carbon layer 204 is doped/implanted with phosphorous or arsenic at an appropriate dose (ions/cm$^2$) and energy (Kilo-electronVolt) to achieve a certain resistivity (ohm-cm) depending on the requirements of the magnetic device being built.

At step 3, the dopants are activated using rapid thermal annealing methods performed in a temperature range of 500-800 degree Celsius in a vacuum or in the presence of an inert gas or any other gas such as hydrogen to obtain the desired resistance values.

At step 4, photoresist is deposited on the layer 204 and lithographic techniques are used to pattern an process the photoresist into islands 208. one embodiment, the photoresist may include an antireflective coating often know was ARC for better optical definition of the photoresist.

At step 5, an etch is performed to form conductive carbon wires 208. This step may include reactive ion etching of the carbon layer 204 using an oxygen-based chemistry or any other suitable gas chemistry. The photoresist is then removed resulting in the carbon conductor wires 208 which would later form conductive wires of a magnetic memory device, e.g. an MRAM memory device, for carrying write currents.

Second Embodiment

Figure 3A:
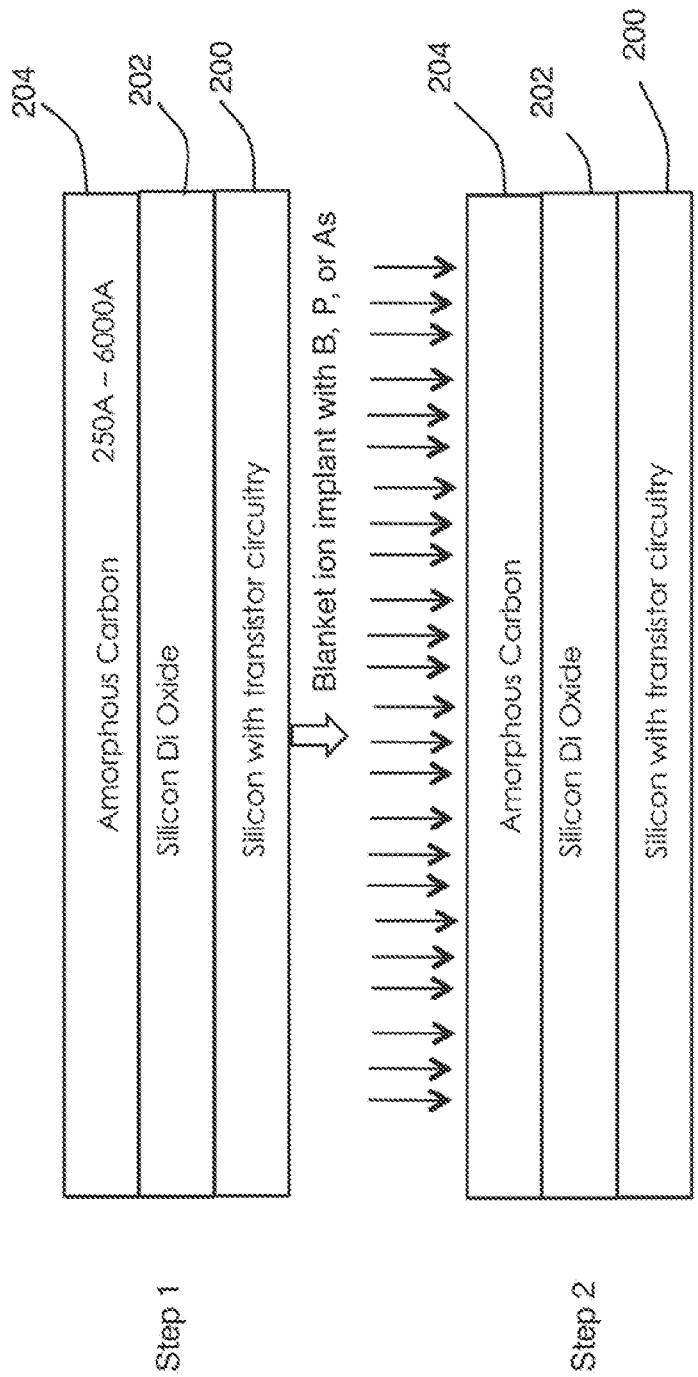
FIGS. 3A-C illustrates a process for forming conductive carbon ribbons for a magnetic memory, in accordance with a second embodiment of the invention.
Figure 3B:
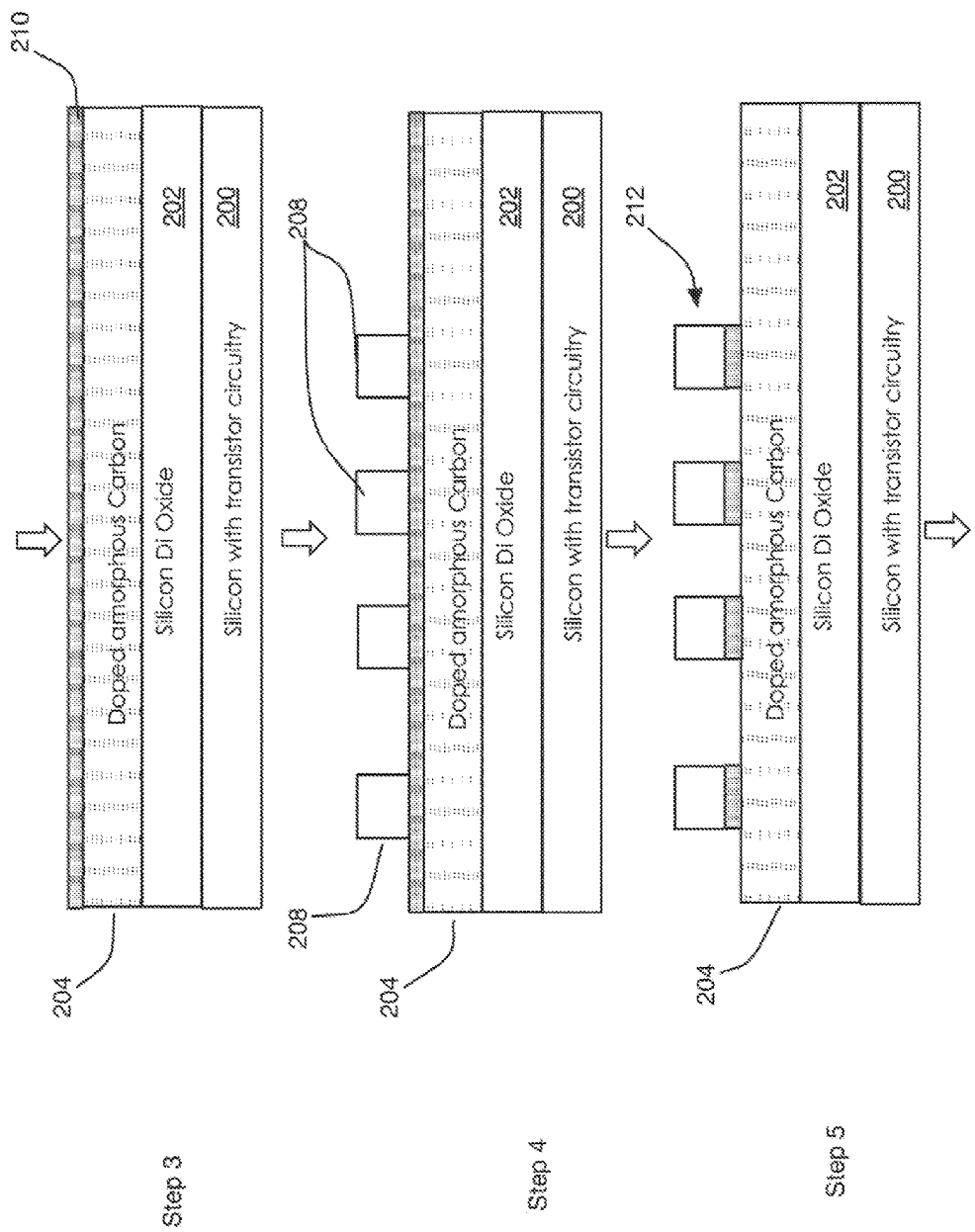
Figure 3C:
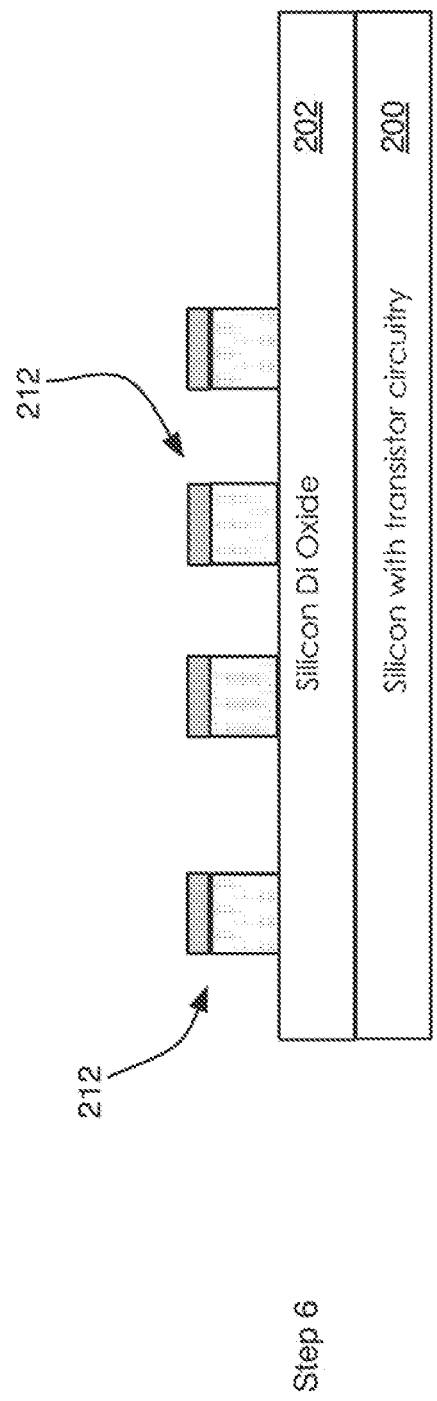

FIGS. 3A-3B illustrate a second embodiment for forming conductive carbon wires for a magnetic memory device. Referring to FIG. 3A, steps 1 and 2 are the same steps 1 and 2 of the first embodiment.

At step 3, a hard mask 210 is deposited over the doped carbon layer 204. The hard mask 210 may comprise aluminum, oxide, or nitride.

At step 4, a photolithographic process is used to deposit and pattern photoresist on the hard mask layer 210. The result of this photolithographic process includes islands of photoresist 208. The hard mask 210 helps to better define the carbon conductors in cases where precise and fine dimensions are required.

At step 5, the hard mask is etched and at step 6 the carbon layer 204 is etched. The result is precisely defined carbon conductors 212 that each include a remnant of the layer 204 and a remnant of the hard mask layer 210, as can be seen from FIG. 3C.

Third Embodiment

Figure 4A:
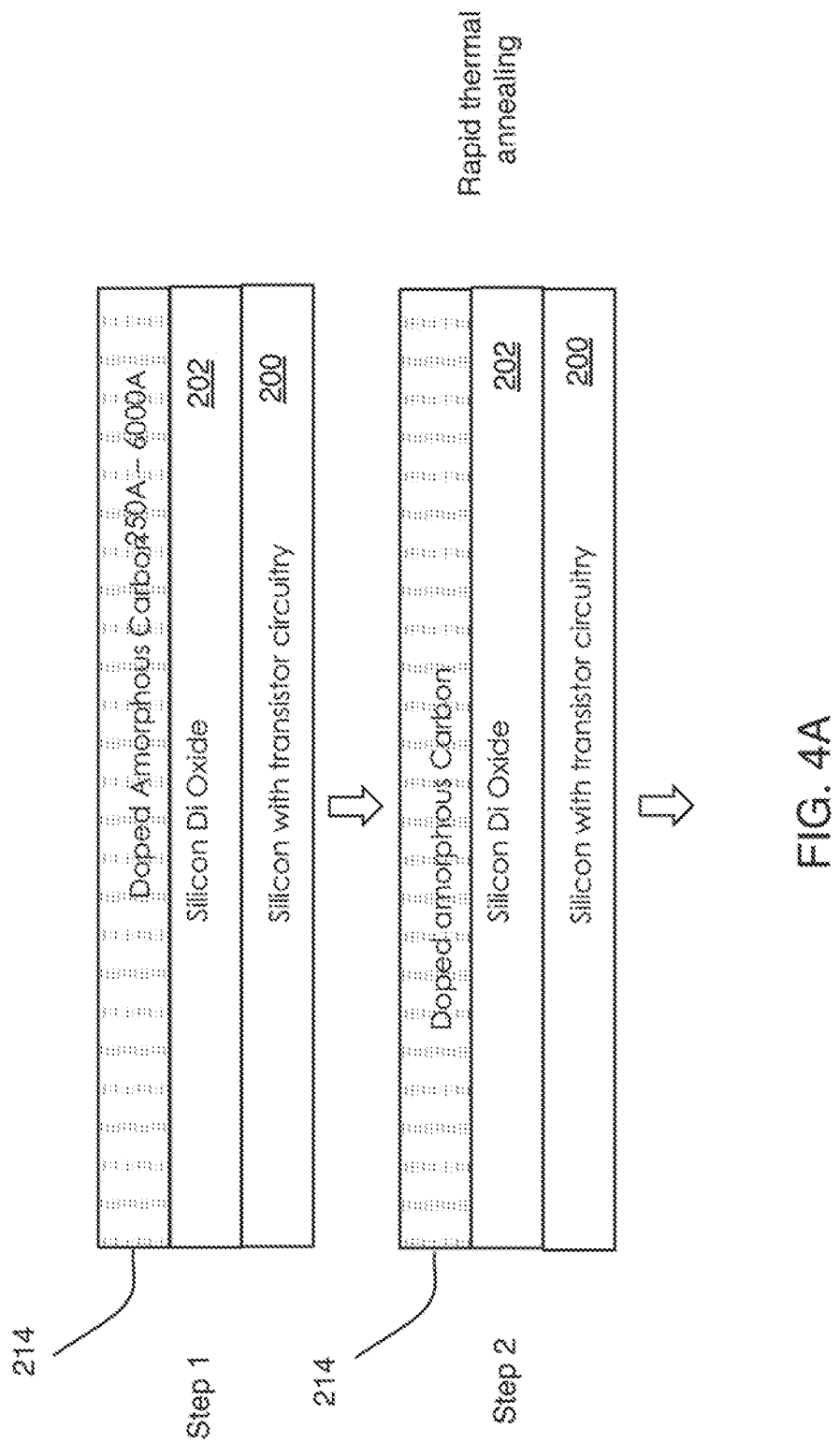
FIGS. 4A-B illustrates a process for forming conductive carbon ribbons for a magnetic memory in accordance with a third embodiment of the invention.
Figure 4B:
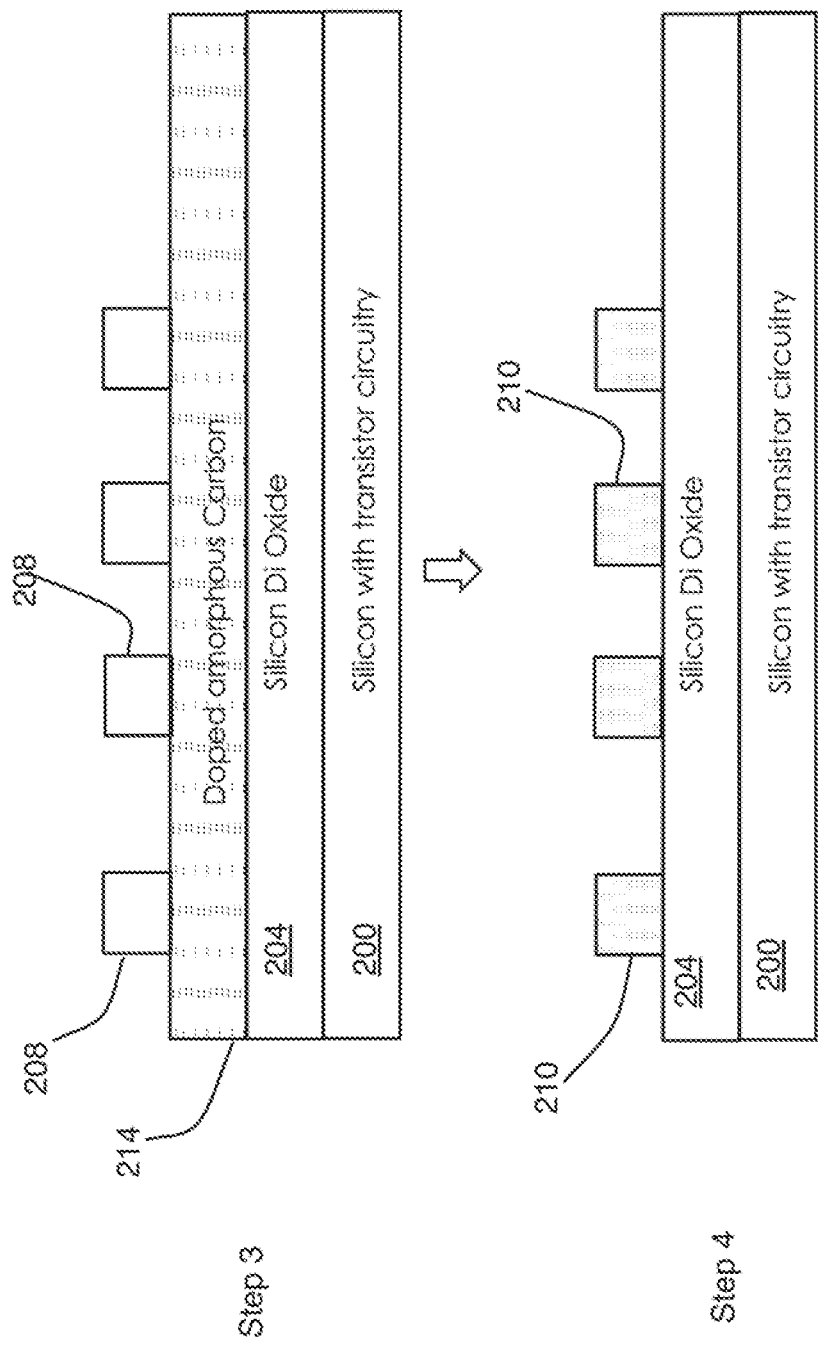

FIGS. 4A-4b illustrates a third embodiment for forming conductive carbon wires for a magnetic memory device. Referring to FIG. 4A, at step 1, a carbon film layer is 214 is deposited over the layer 202 using PECVD (Plasma Enhanced Chemical Vapor Deposition) techniques and a C2H2, C3H6 or similar source. This step is similar to the first step of the first embodiment. However, a gas phase dopant may be included with the source thereby to avoid a separate doping step such the step 2 of the first embodiment. According to different embodiments, the dopants may include phosphorous, arsenic, or nitrogen and may be from a gas phase source such as POCl3 (phosphoryl chloride), arsine, and N$_2$.

At step 2, the dopants thus incorporated chemically are activated using rapid thermal annealing methods in a temperature range of 500-800 C. The rapid thermal annealing may be carried out in a vacuum, or in the presence of inert gas or any other gas such as hydrogen to tune the resistance values desired.

At step 3, lithographic techniques are used to pattern and process photoresist on the carbon film 214 into islands of photoresist 208 to protect the underlying carbon film 214 during etching.

At step 4, an etch is performed. This step may include reactive ion etching of carbon using an oxygen based chemistry or any other suitable gas chemistries. The photoresist is then removed resulting in the carbon conductor wires 210 which would form the conductive wires of an MRAM memory cell that carries a write current.

Fourth Embodiment

Figure 5A:
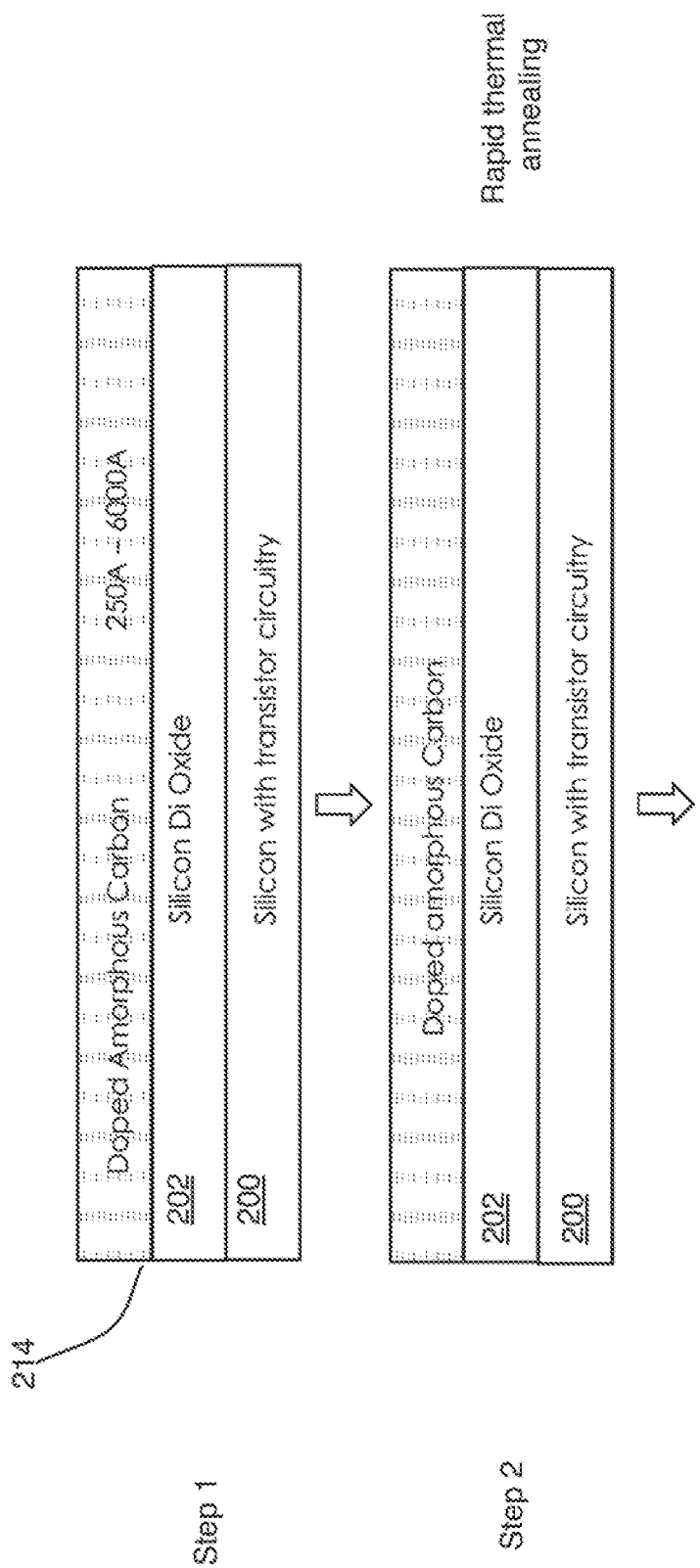
FIGS. 5A-C illustrates a process for forming conductive carbon ribbons for a magnetic memory, in accordance with a fourth embodiment of the invention.
Figure 5B:
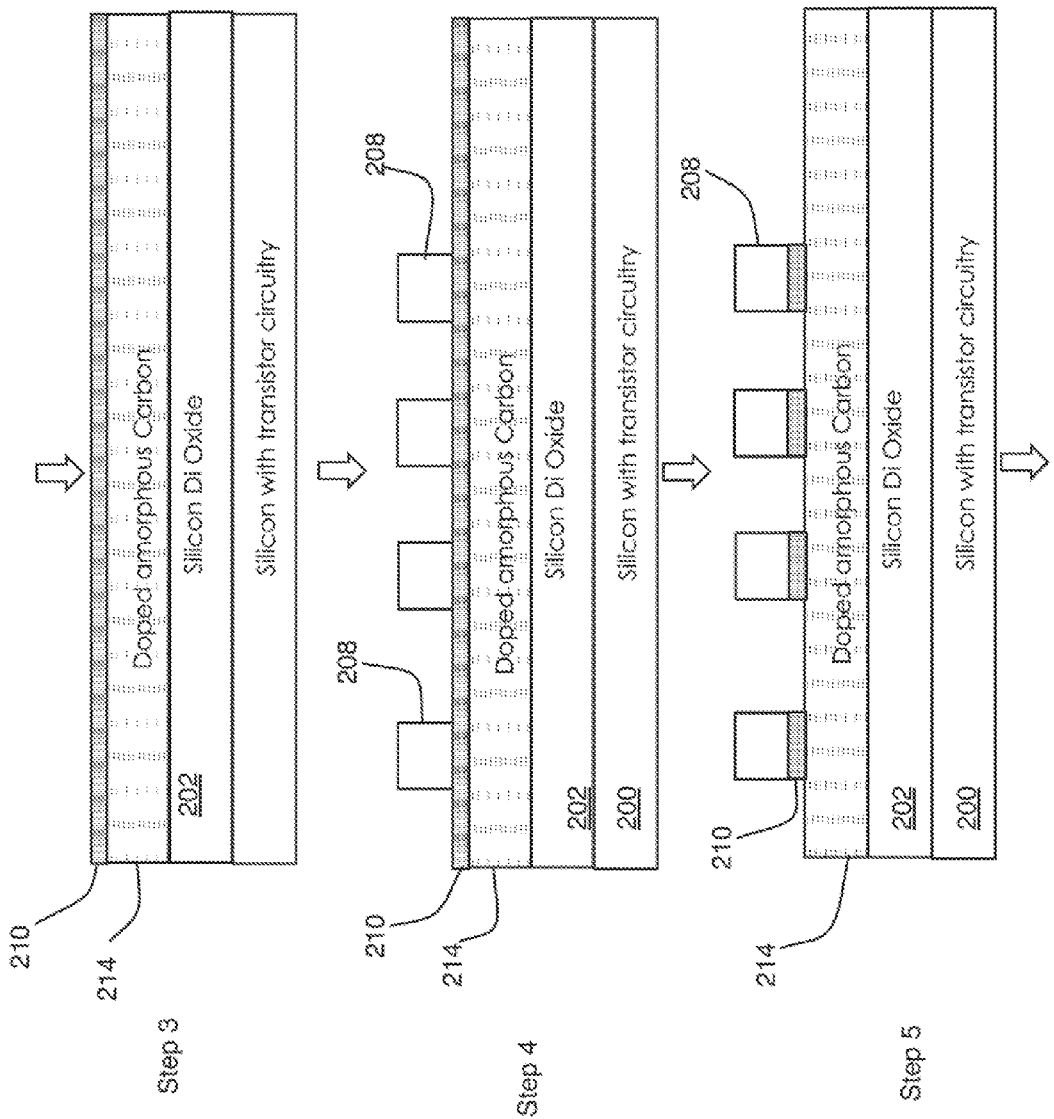
Figure 5C:
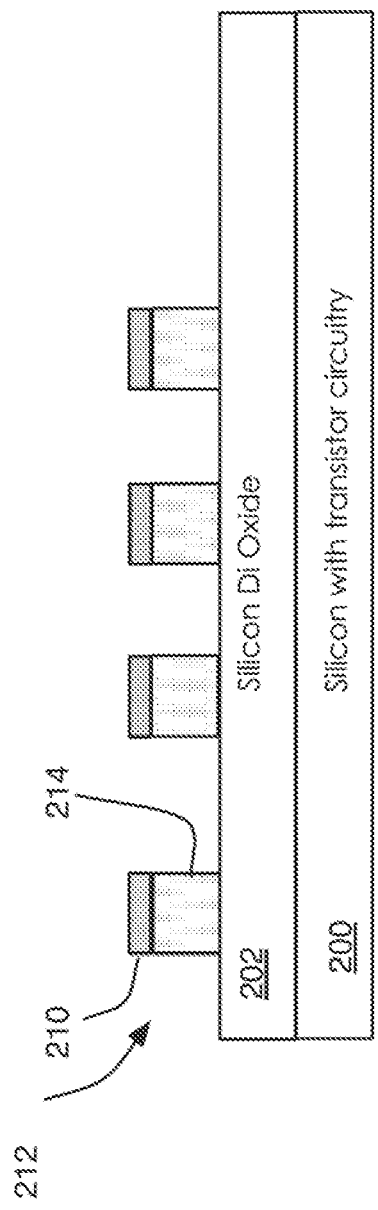

This embodiment is described with reference to FIGS. 5A-5C. At step 1, which is similar to the step 1 of the third embodiment, a carbon film layer is deposited from C2H2, C3H6, or similar source by PECVD (Plasma Enhanced Chemical Vapor Deposition). Dopants such as phosphorous, arsenic, or nitrogen are incorporated into the layer 400 from a suitable gas-phase dopant source such as POCl3 (phosphoryl chloride), arsine, or N$_2$.

At step 2, the dopants are activated using rapid thermal annealing methods carried out at a temperature range of 500-800 degrees C in a vacuum or in the presence of an inert gas or any other gas such as hydrogen to tune the resistance values desired.

At step 3 includes a hard mask layer 210 such as aluminum, oxide, or nitride is deposited at step 4, This a photoresist layer is deposited, patterned and process using photolithographic techniques to define island of photoresist 208 on the hard mask layer 210. The hard mask helps to better define the carbon conductors in cases where precise and fine dimensions are critical. At step 5, the hard mask layer is etched, and at step 6 the carbon layer 214 is etched. The result is a plurality of conductive carbon wires 212 the run into the plane of the drawing. Each conductive area has a portion that corresponds to the layer 214 and a portion that corresponds to the layer 210.

Fifth Embodiment

Figure 6A:
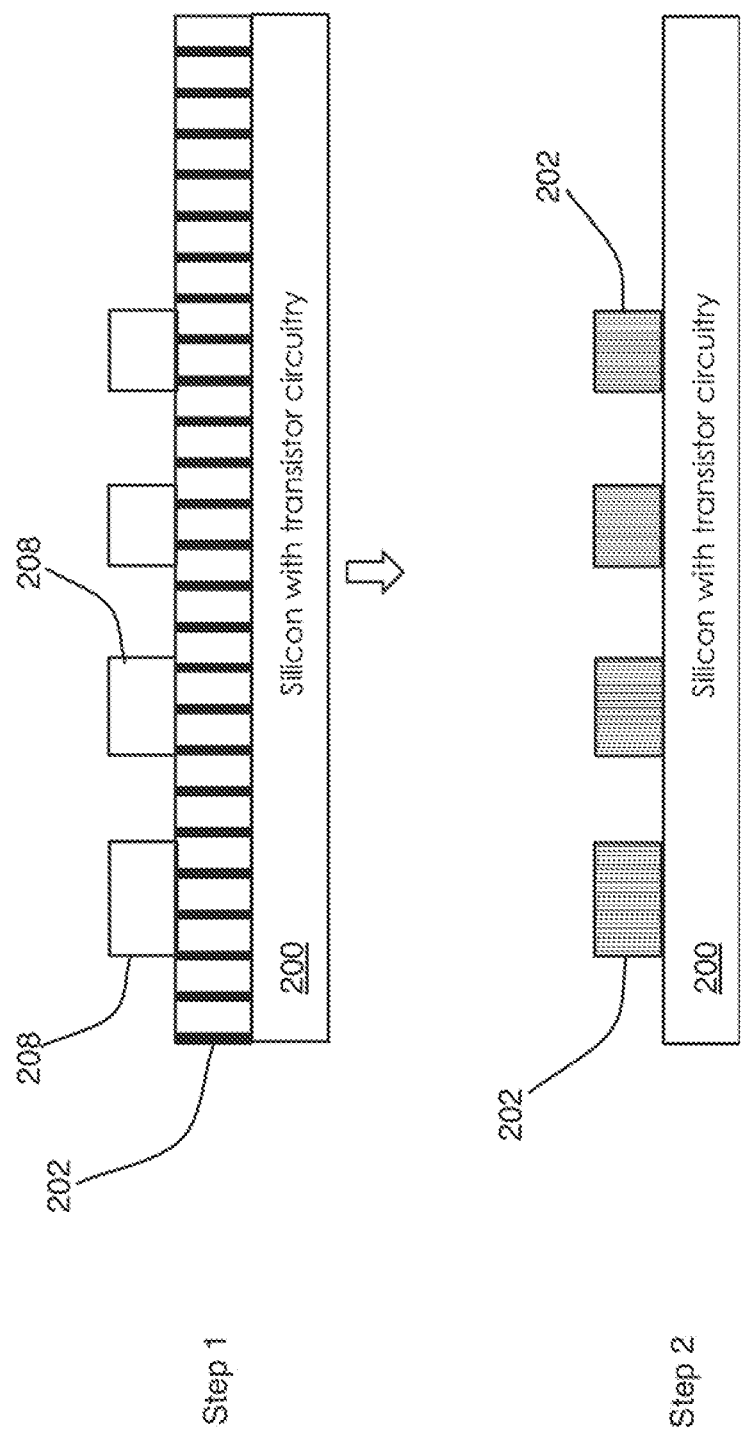
FIGS. 6A-B illustrates a process for forming conductive carbon ribbons for a magnetic memory, in accordance with a fifth embodiment of the invention.
Figure 6B:
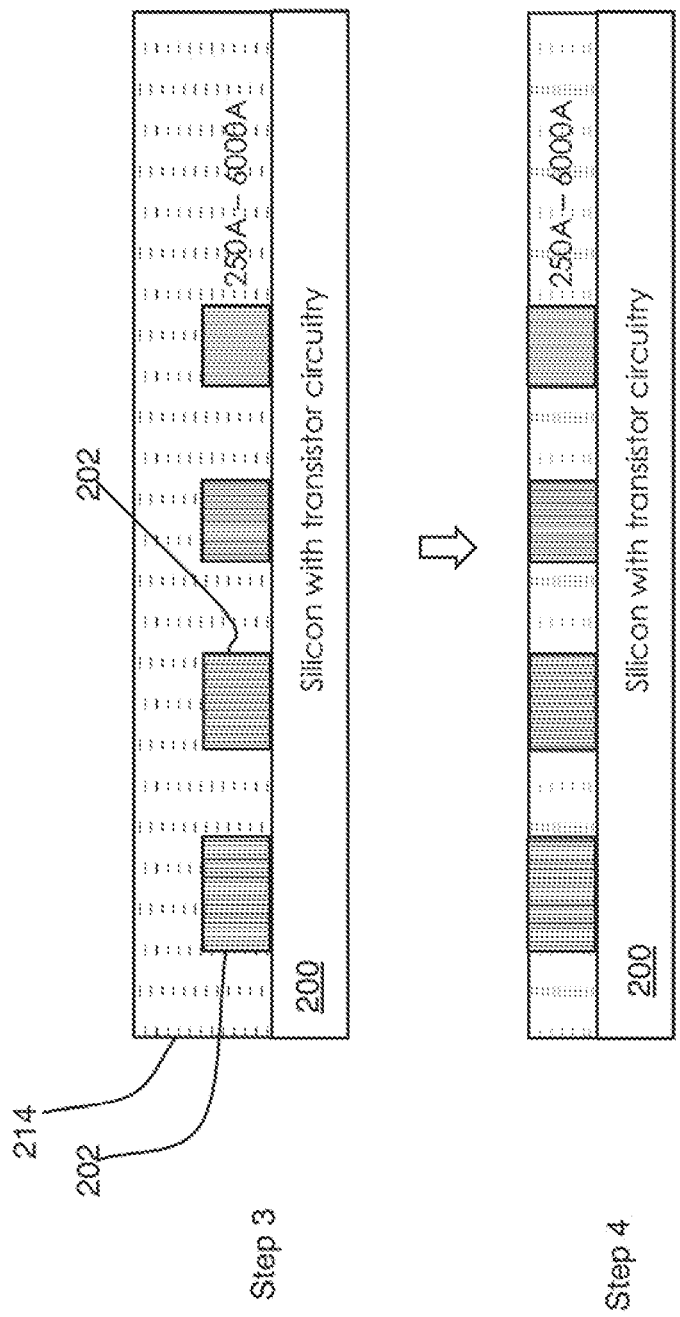

FIGS. 6A and 6B illustrate is a fifth embodiment for fabricating conductive carbon wires/ribbons for magnetic memory devices. In this embodiment, the conductive carbon wires are fabricated by chemical doping and CMP (Chemical Mechanical Polishing). At step 1, a layer of photoresist is deposited over a substrate comprising a layer 200 with prefabricated transistor circuitry, and a dielectric layer 202. Using photolithographic techniques, the photoresist is patterned and processed to leave behind islands of photoresist 208 that serve to protect the underlying dielectric layer 202 during etching.

At step 2, the dielectric layer 202 is etched by well known methods in the semiconductor industry to form trenches that are 250 angstroms to 6000 angstroms deep.

At step 3, doped carbon film layer 214 from C2H2, C3H6 or a similar source is deposited by PECVD (Plasma Enhanced Chemical Vapor Deposition).

At step 4, the layer 214 is processed by CMP techniques. The CMP is performed until the layer 214 is flush with the dielectric 202. The result is structure that include dielectric trenches 202 separated by conductive carbon ribbons 210 that run into the plane of the drawing. The carbon ribbons 210 thus formed may be used as a wire of an MRAM memory cell to carry a write current.

Sixth Embodiment

Figure 7A:
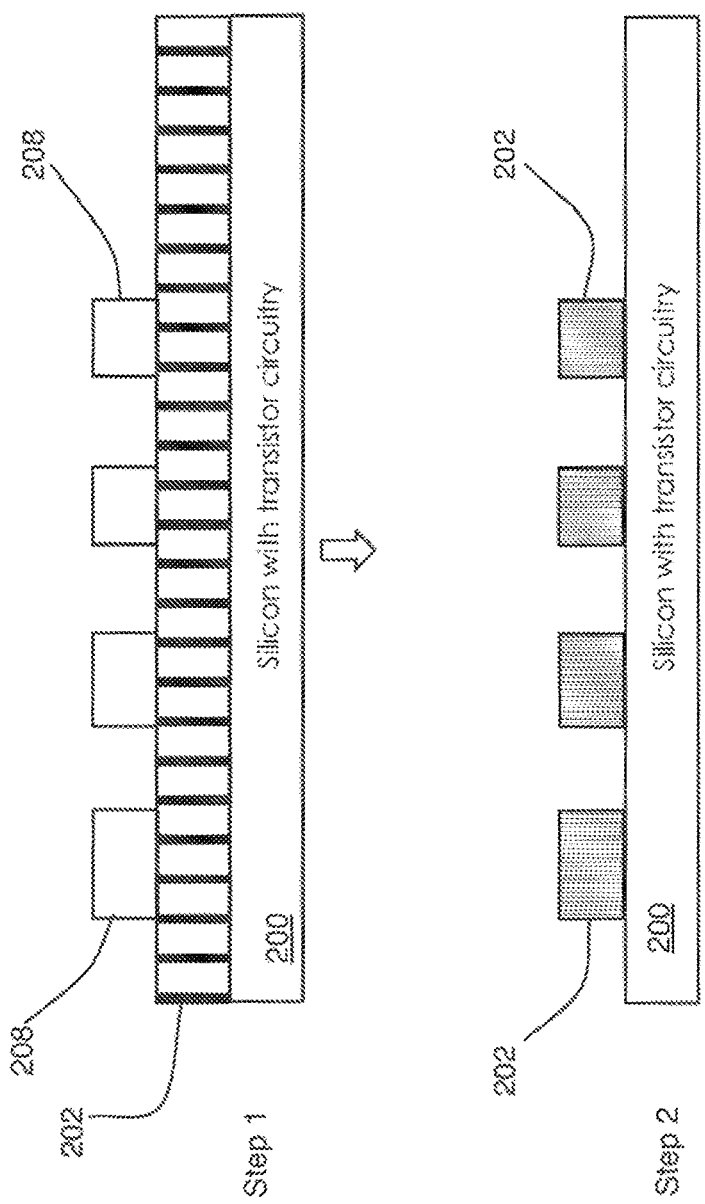
FIGS. 7A-B illustrates a process for forming conductive carbon ribbons for a magnetic memory, in accordance with a sixth embodiment of the invention.
Figure 7B:
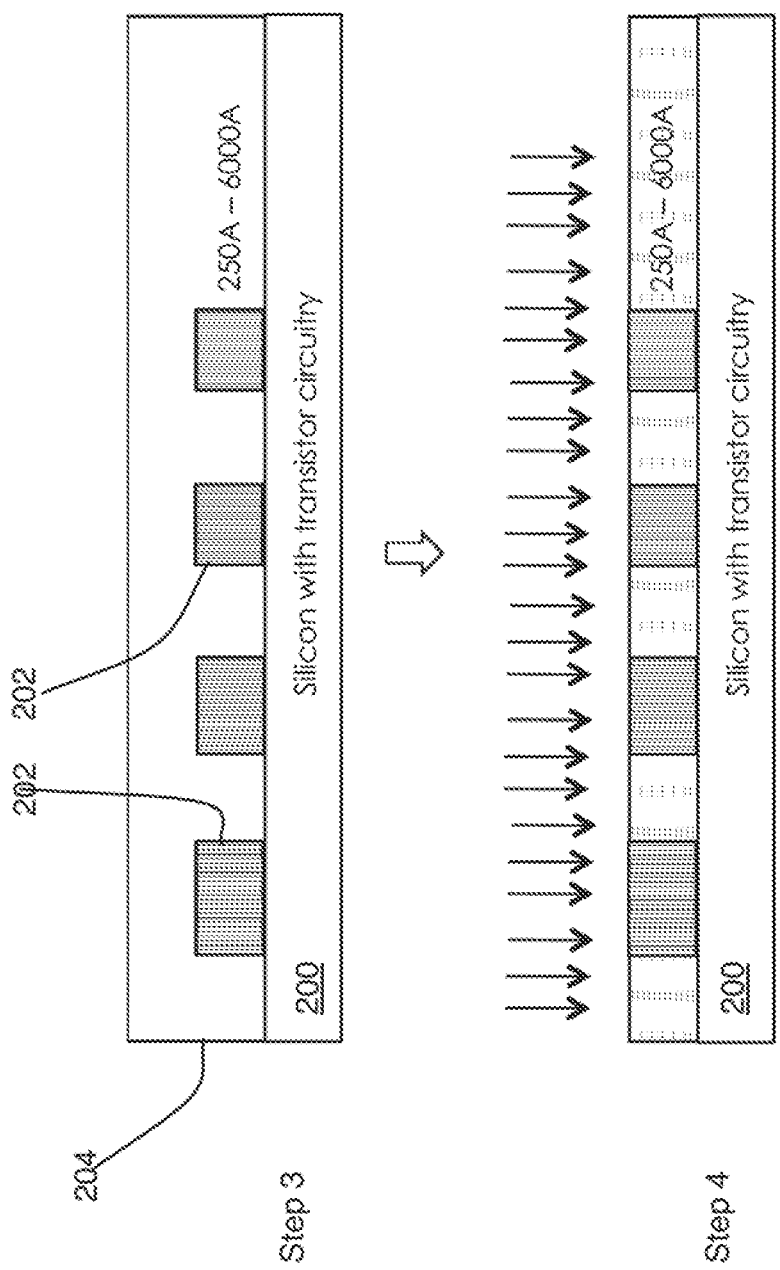

FIGS. 7A and 7B of the drawings illustrate a sixth embodiment for fabricating conductive carbon wires for a memory device such as an MRAM memory device. This embodiment is similar to the fifth embodiment except the implant doping is used instead of chemical doping.

At step 1, photoresist islands 208 are defined photolithographically on oxide or nitride layer 204 on a semiconductor wafer 200 with transistor circuits prefabricated thereon.

At step 2, the dielectric 202 is etched by well known methods in the semiconductor industry to form trenches that are 250 angstroms to 6000 angstroms deep.

At step 3, carbon film layer 204 from C2H2, C3H6 or a similar source is deposited by PECVD (Plasma Enhanced Chemical Vapor Deposition).

At step 4, CMP techniques are used on the carbon film layer 204 to reduce the layer so that it is flush with the dielectric islands 202. The result is a structure which includes carbon ribbons/wires 208 separated by islands or strips of dielectric trenches 202.

Next an ion implantation step is performed to implant a dopant into the wires 208 with B, P, or As, or similar ions. Finally a rapid thermal annealing step is done to activate the dopants. The rapid thermal annealing step may be performed in a vacuum or in the presence of an inert gas or any other gas such as hydrogen.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A method, comprising:
selectively etching a dielectric layer disposed on a semiconductor layer that includes circuits to form a plurality of trenches that expose the semiconductor layer;
depositing a carbon layer over the dielectric layer and portions of the semiconductor layer that are exposed to fill the plurality of trenches with carbon;
removing at least a portion of the carbon layer so that carbon resident in the trenches is separated from carbon in adjacent trenches by dialectic material of the dielectric layer;
implanting dopants in the carbon resident in the plurality of trenches; and
activating the dopants in the carbon deposited in the plurality of trenches.

2. The method of claim 1, further comprising forming a plurality of magnetic tunnel junction (MTJ) stacks such that each MTJ stack is positioned above a trench of the plurality of trenches.

3. The method of claim 1, further comprising:
depositing a photoresist on the dielectric layer; and
forming the photoresist into a plurality of islands on the dielectric layer;
wherein said selective etching comprises removing portions of the dielectric layer that are not covered by the plurality of islands.

4. The method of claim 3, wherein said forming the photoresist into a plurality of islands utilizes a lithographic process.

5. The method of claim 1, wherein said selective etching forms the plurality of trenches to a depth of 250 angstroms to 6,000 angstroms.

6. The method of claim 1, wherein said activating comprises using a rapid annealing process to activate the dopants.

7. The method of claim 1, wherein said activating comprises using a rapid annealing process in a vacuum to activate the dopants.

8. The method of claim 1, wherein said activating comprises using a rapid annealing process in presence of an inert gas to activate the dopants.

9. The method of claim 1, wherein said activating comprises using a rapid annealing process in presence of hydrogen to activate the dopants.

10. A method, comprising:
selectively etching a dielectric layer disposed on a semiconductor layer that includes circuits to form a plurality of trenches that expose the semiconductor layer;
depositing a carbon layer comprising dopants over the dielectric layer and portions of the semiconductor layer that are exposed to fill the plurality of trenches with carbon;
removing at least a portion of the carbon layer so that carbon resident in the trenches is separated from carbon in adjacent trenches by dialectic material of the dielectric layer; and
activating the dopants in the carbon resident in the plurality of trenches.

11. The method of claim 10, further comprising forming a plurality of magnetic tunnel junction (MTJ) stacks such that each MTJ stack is positioned above a trench of the plurality of trenches.

12. The method of claim 10, further comprising:
depositing a photoresist on the dielectric layer; and
forming the photoresist into a plurality of islands on the dielectric layer;
wherein said selective etching comprises removing portions of the dielectric layer that are not covered by the plurality of islands.

13. The method of claim 12, wherein said forming the photoresist into the plurality of islands utilizes a lithographic process.

14. The method of claim 10, wherein said selective etching forms the plurality of trenches to a depth of 250 angstroms to 6,000 angstroms.

15. The method of claim 10, wherein said depositing a carbon layer comprises a Plasma Enhanced Chemical Vapor Deposition (PECVD) of the carbon layer using a carbon source and a gas-phase dopant source.

16. The method of claim 10, wherein said depositing a carbon layer comprises a Plasma Enhanced Chemical Vapor Deposition (PECVD) of the carbon layer using a carbon source selected from a first group comprising C2H2 and C3H6 and a gas-phase dopant source selected from a second group comprising POCl3 (phosphoryl chloride), arsine, and nitrogen (N2).

17. The method of claim 1, wherein said implanting comprises implanting ions selected from the group comprising boron, phosphorus, and arsenic.

18. The method of claim 10, wherein said depositing a carbon layer comprises a Plasma Enhanced Chemical Vapor Deposition (PECVD) of the carbon layer using a carbon source selected from a first group comprising C2H2 and C3H6 and a gas-phase dopant source selected from a second group comprising phosphorous, arsenic, and nitrogen.

19. The method of claim 10, wherein said activating comprises using a rapid annealing process in a vacuum to activate the dopants.

20. The method of claim 10, wherein said activating comprises using a rapid annealing process in presence of an inert gas to activate the dopants.

\* \* \* \* \*